United States Patent [19]
Babineau et al.

[11] Patent Number: 6,047,172
[45] Date of Patent: Apr. 4, 2000

[54] TRANSCEIVER ASSEMBLY WITH AN ELECTROMAGNETIC SHIELD

[75] Inventors: Paul J. Babineau, Ashburnham; Kelly Rogers, Haverhill, both of Mass.

[73] Assignee: 3Com Corporation, Santa Clara, Calif.

[21] Appl. No.: 09/037,848

[22] Filed: Mar. 10, 1998

[51] Int. Cl.[7] ...................................................... H04B 1/10

[52] U.S. Cl. ........................... 455/300; 455/90; 455/117; 455/301; 316/800; 316/816

[58] Field of Search ..................................... 439/607, 609, 439/79, 353; 455/300, 301, 117, 347, 348, 349, 128, 90; 361/816, 800, 818

[56] References Cited

U.S. PATENT DOCUMENTS

| | | | |
|---|---|---|---|
| 5,323,298 | 6/1994 | Shatas et al. | 361/816 |
| 5,767,999 | 6/1998 | Kayner | 359/163 |

*Primary Examiner*—Lee Nguyen
*Attorney, Agent, or Firm*—McGlew and Tuttle, P.C.

[57] ABSTRACT

A carrier and shield arrangement, where the transceiver of a circuit board is exchangeable through the front panel of a station in the computer network. The shield physically connects to the carrier mounted on the circuit board, where the carrier receives the transceiver and electrically connects the transceiver to the circuitry on the circuit board. The shield has two walls, a cover and a panel portion which are formed of a material to block electromagnetic interference. The walls are electrically connectable to the circuit board, and a panel portion of the shield is electrically connectable to the carrier and to the front panel.

15 Claims, 6 Drawing Sheets

TRANSCEIVER ASSEMBLY WITH AN ELECTROMAGNETIC SHIELD

FIELD OF THE INVENTION

The present invention relates in general to attachments to a transceiver in a computer network, and in particular to the electrical and physical connections between a shield and carrier for a transceiver.

BACKGROUND OF THE INVENTION

In computer networks data signals are generated in a workstation, transmitted over a media such as twisted wire, coaxial cable or fiber optic cable. The data then usually passes through many intermediate stations such as repeaters, switches and routers. The data signal needs to be placed in the proper form to travel over the particular media, and after the data signal has finished traveling through the media, it must be converted into the form that the receiving apparatus can use. With the desire for higher data rates, and the corresponding limitations of the media, the data signal needs to be placed in a very special form to travel over the media at high data rates, especially over long distances. Correspondingly the data signal needs to be received from the media in a special manner, and converted into the form used by the receiving apparatus. A transceiver is used to place the data signal in the proper form for transmission through the media, and for properly receiving the data signal from the media and converting it into the proper form for the apparatus.

As data rates become higher and higher, and must be transmitted over longer and longer distances, transceivers have become more complex and more specialized for the specific type of media.

Intermediate stations in a computer network must often have to be able to connect to different types of media, and each type of media requires its own type of transceiver. An intermediate station only capable of connecting to one type of media is often very limiting and impractical. Also intermediate stations which have separate connections for the different types of media can be very uneconomical since significant capacity needs to be provided for each type of media, even though very few if any of a particular media might be used.

A transceiver style and corresponding carrier are known from the company AMP located at Harrisburg, Pa., U.S.A., where the carrier can be mounted to the circuit board of the intermediate station, and transceivers can be easily mounted on the carrier through an opening in a front panel of the intermediate station. This carrier is known as model number 787663. Transceivers can then be switched in and out to accommodate the media being used. Such transceivers are available from IBM model # SOC-1063/1250 Rochester, Minn., VIXEL CORP., 325 Interlocken Parkway, Broomfield, Colo. 80021 and Fujikura America, Incorp., 3001 Oakmead Village Drive, Santa Clara, Calif. 95051.

As data rates increase the data signals begin to act like radio waves and produce unwanted electrical magnetic waves. This is especially true in the transceivers, where the processing of the data signal includes many characteristics which radiate electromagnetic waves as the data rates become higher. Also as computer networks increase in size, many more transceivers are included in intermediate stations and it is desirable to place them in as small an area as possible. This leads to electromagnetic waves from one transceiver interfering with the operation of adjacent transceivers. This electromagnetic interference limits the data rate of the signals, and how close the transceivers can be positioned next to each other.

SUMMARY AND OBJECTS OF THE INVENTION

It is a primary object of the present invention to reduce electromagnetic interference between adjacent mounted transceivers using the AMP carrier, in order to increase the data rates of the transceivers, and to allow closer placement of the transceivers.

The present invention accomplishes this objective by providing first and second walls electrically connectable to the circuit board to which the transceiver is mounted by means of the carrier. The walls include means, preferably in the form of the material of the walls, to block electromagnetic interference through the walls. The walls are positionable on opposite sides of the transceiver and carrier. A cover is electrically connected to the walls and is positioned adjacent a side of the transceiver opposite the circuit board and the carrier. The cover also has means in the form of the material of the cover, to block electromagnetic interference through the cover. A panel portion is electrically connected to the two walls and the cover. The panel portion has means for electrically connecting to the panel through which the carrier receives the transceiver. The panel portion also has means for blocking electromagnetic interference through the panel portion and has carrier electrical connection means for electrically connecting the panel portion to a ground of the carrier. The carrier includes a panel side defining an opening for receiving a transceiver, and the panel side includes a leaf spring electrically connected to the ground of the carrier means. The carrier electrical connection means includes a carrier surface on the panel portion which comes into electrical contact with the leaf spring of the carrier means. The carrier means also has ground means for connecting the ground of the carrier means to a ground of the transceiver, and also a ground of the media cable which is connected to the transceiver. These ground connections, in addition to the electrical connection of the panel portion to the panel, and of the walls to the circuit board, cause the cover, the two walls and panel portion to be a very effective electromagnetic shield for the transceiver mounted in this particular carrier.

The walls of the shield are provided with locking connection means for physically locking the shied to the carrier. The locking connection means includes a tab formed on each wall, and each tab has an angled portion. The carrier has grooves on opposite sides adjacent the walls, and this groove receives the angle portions of the tabs.

The panel connection means includes a leaf spring extending from a panel surface of the panel portion, and which is in electrical contact with the panel. The panel surface and the carrier surface of the panel portion are on substantially opposite sides of the panel portion.

The two walls, cover and panel portion are preferably formed from a single piece of sheet metal, possibly aluminum, steel or copper, and is designed to connect to the carrier means of AMP. This shield, in combination with the carrier, provides a transceiver assembly which allows for higher data rates of the transceiver, and close spacing of the transceivers. The shield of the present invention also provides for transceiver assemblies which are simple in design, economical to manufacture and beneficial for increasing the data rate and decreasing the distances between transceivers.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which a preferred embodiment of the invention is illustrated.

DESCRIPTION OF THE PREFERRED EMBODIMENT

Figure 1:
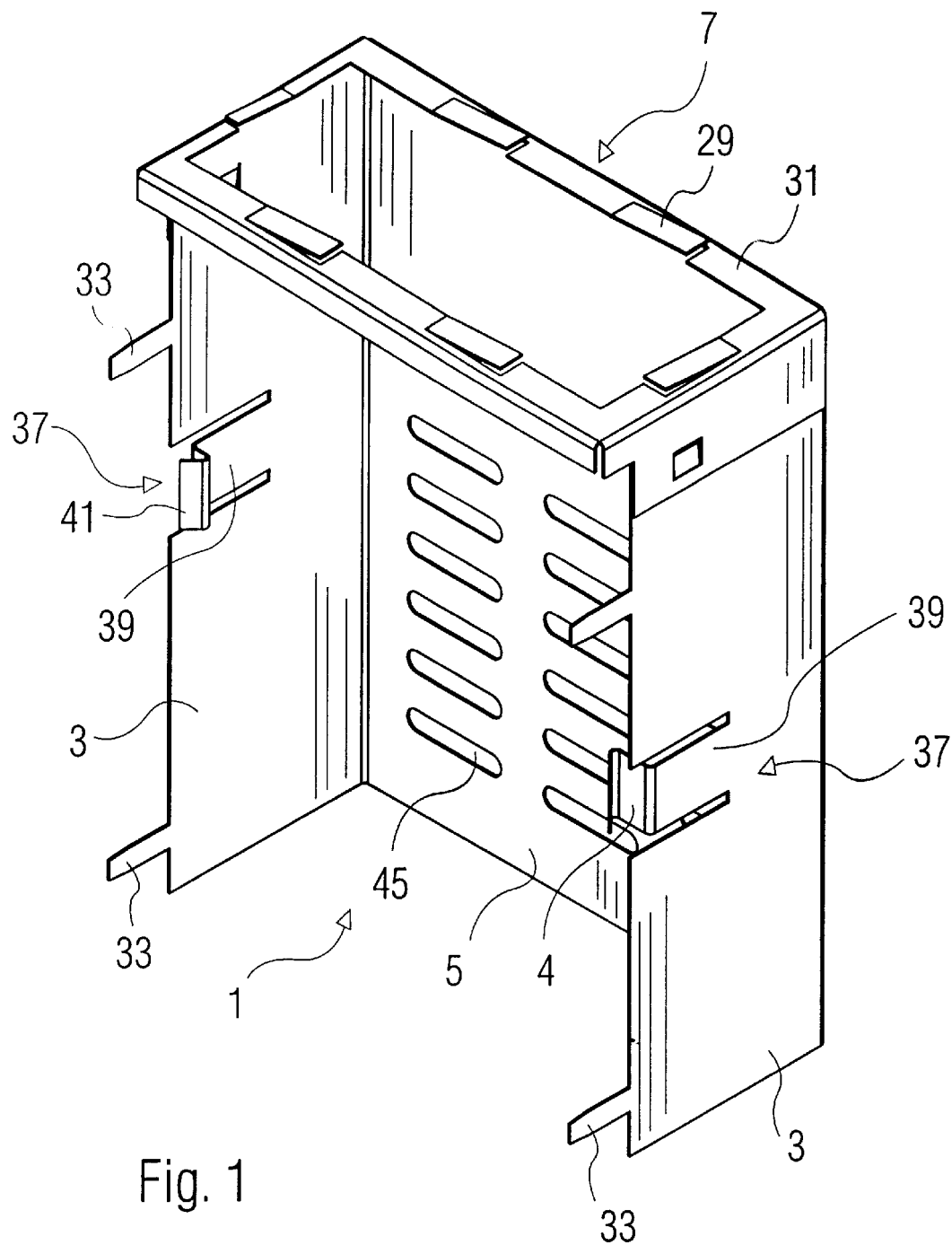
FIG. 1, is a perspective view of the shield of the present invention.

Referring to the drawings, in particular to FIG. 1, the shield 1 of the present invention comprises two walls 3 and a cover 5. A panel portion 7 is connected to the walls 3 and cover 5. The walls 3, cover 5 and panel portion 7 are all electrically connected to each other, and are preferably formed from a single sheet of metal.

Figure 2:
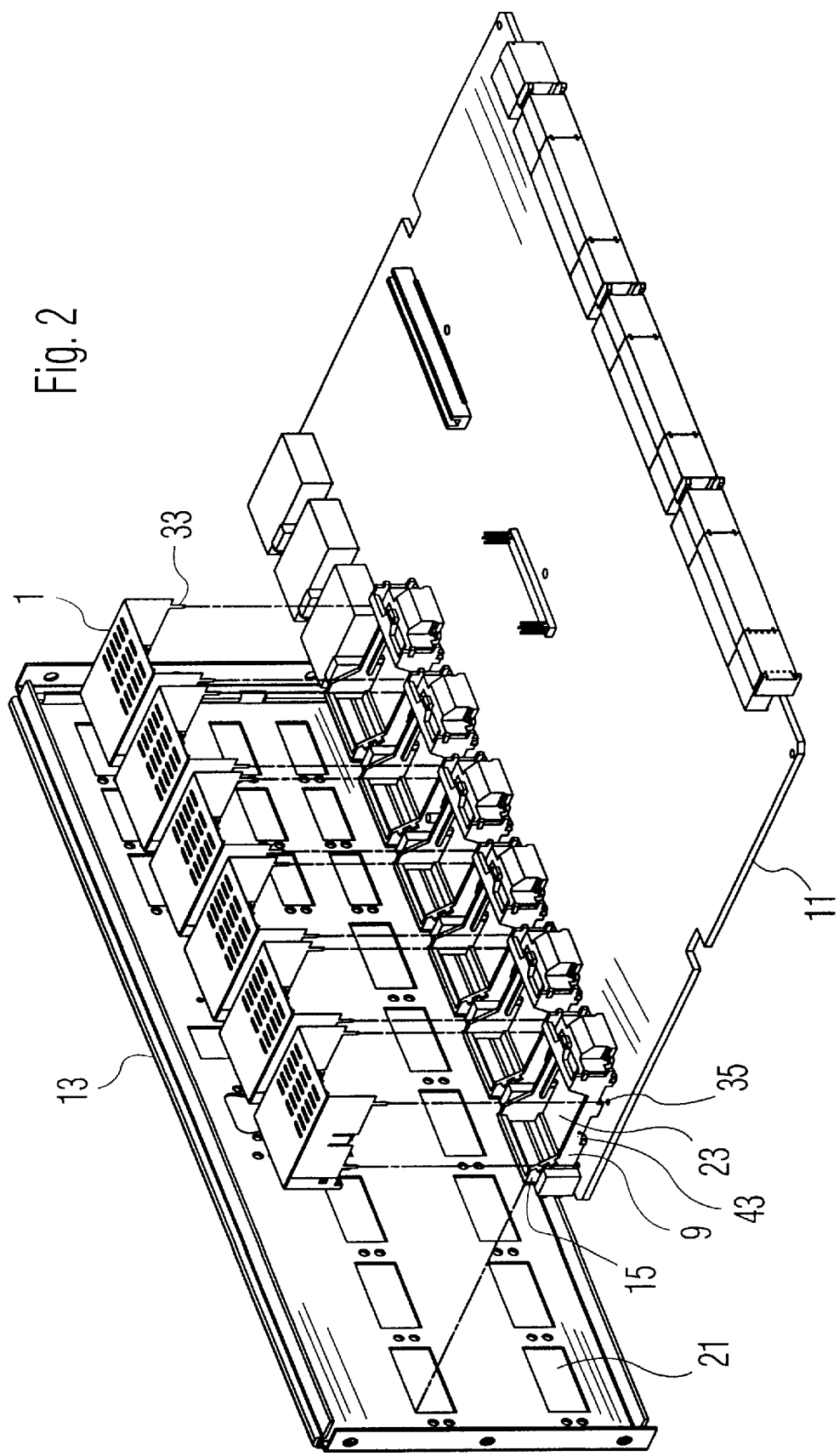
FIG. 2, is a perspective exploded view of the transceiver assembly on a circuit board and front panel arrangement.
Figure 3:
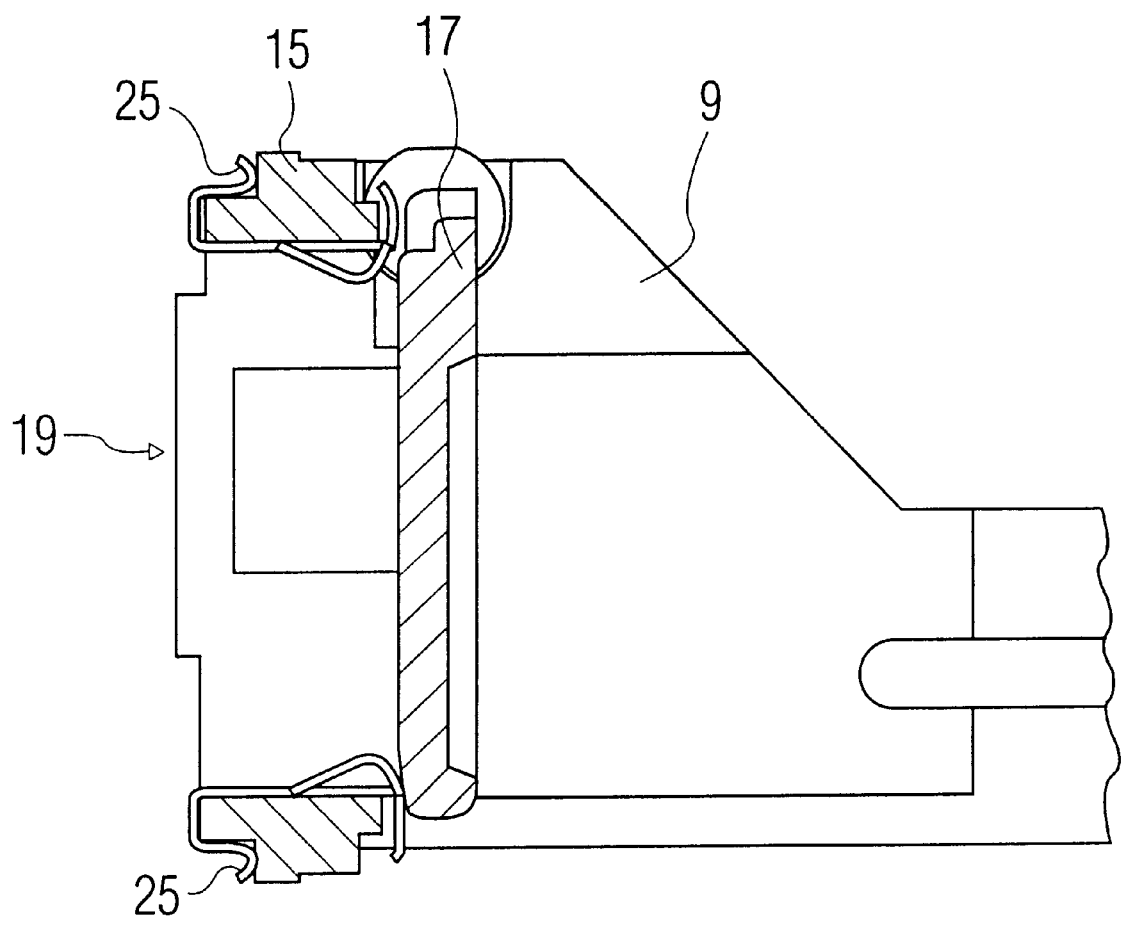
FIG. 3, is a cross sectional view of the carrier means.

As shown in FIG. 2, the shield 1 mounts on top of a carrier 9, and the carrier 9 is mounted on the circuit board 11. The entire circuit board 11 is mounted adjacent to a front panel 13, with the carriers 9 mounted on the edge of the circuit board 11 which is adjacent to the firm panel 13. The transceiver has a panel side 15 defining an opening 19. A hinged door 17 opens and closes the opening 19. The front panel 13 defines openings 21 for each of the carriers 9. The transceiver is inserted through the panel opening 21, through the carrier opening 19 and into the carrier cavity 23 where the transceiver is electrically connected to the circuits on the circuit board 11. The panel side 15 of the carrier 9 has a leaf spring 25 which is electrically connected to a ground of the carrier. When the transceiver is inserted into the carrier 9, the ground of the carrier 9 is electrically connected to the ground of the transceiver. Also when a media cable is connected to the transceiver, the ground of the cable is also electrically connected to the ground of the carrier 9.

Figure 4:
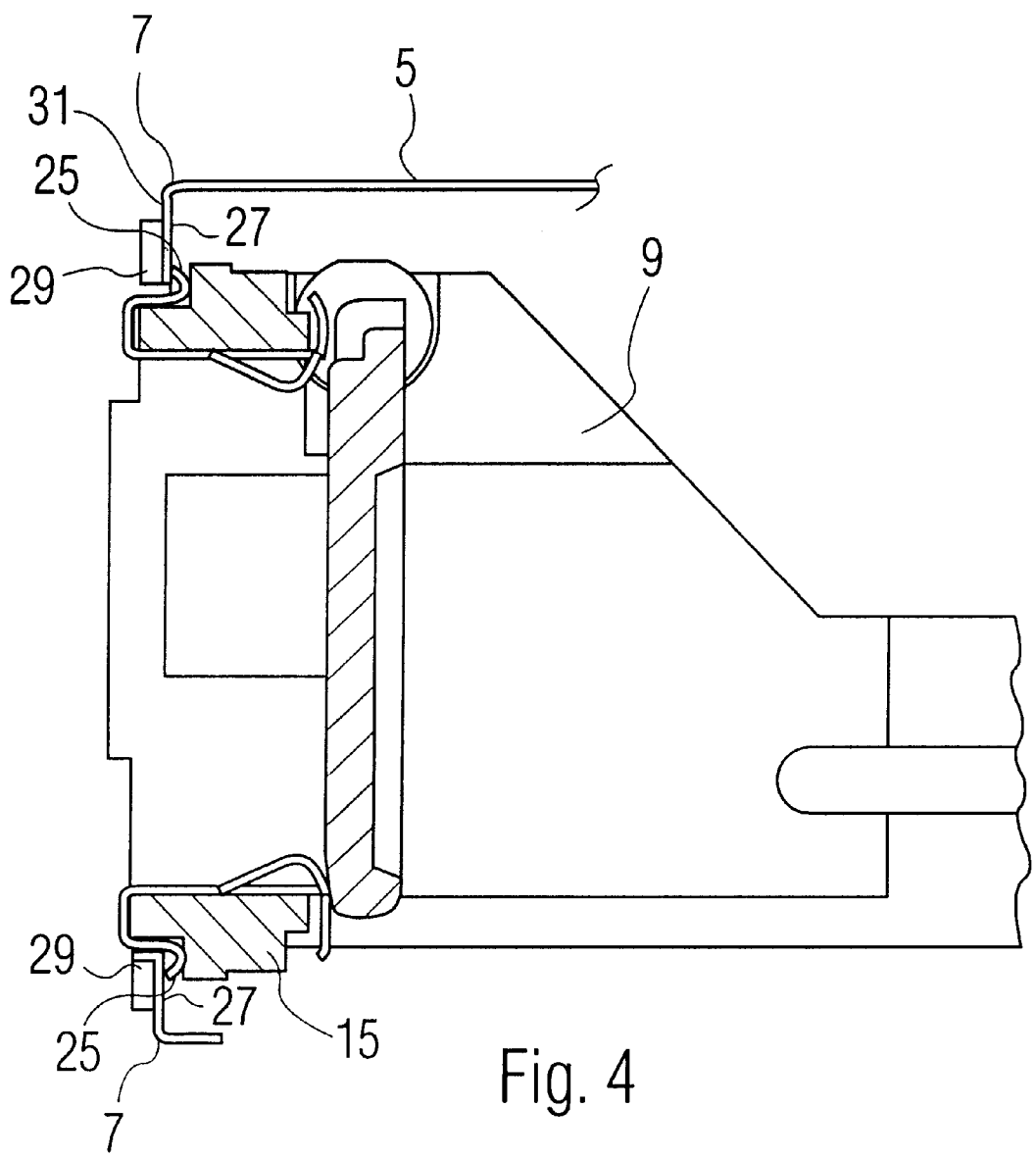
FIG. 4, is a partial cross sectional view of the carrier means with the shield attached.

As shown in FIG. 4, the panel portion 7 has a carrier surface 27 which electrically contacts the leaf spring 25 of the carrier 9. The panel portion 7 also has leaf springs 29 extending from a panel surface 31 of the panel portion 7. These leaf springs 29 are electrically connected to the panel portion 7 and electrically contact the front panel 13 when the shield 1 is mounted on the carrier 9 and the circuit board 11 is connected to the front panel 13.

Figure 5:
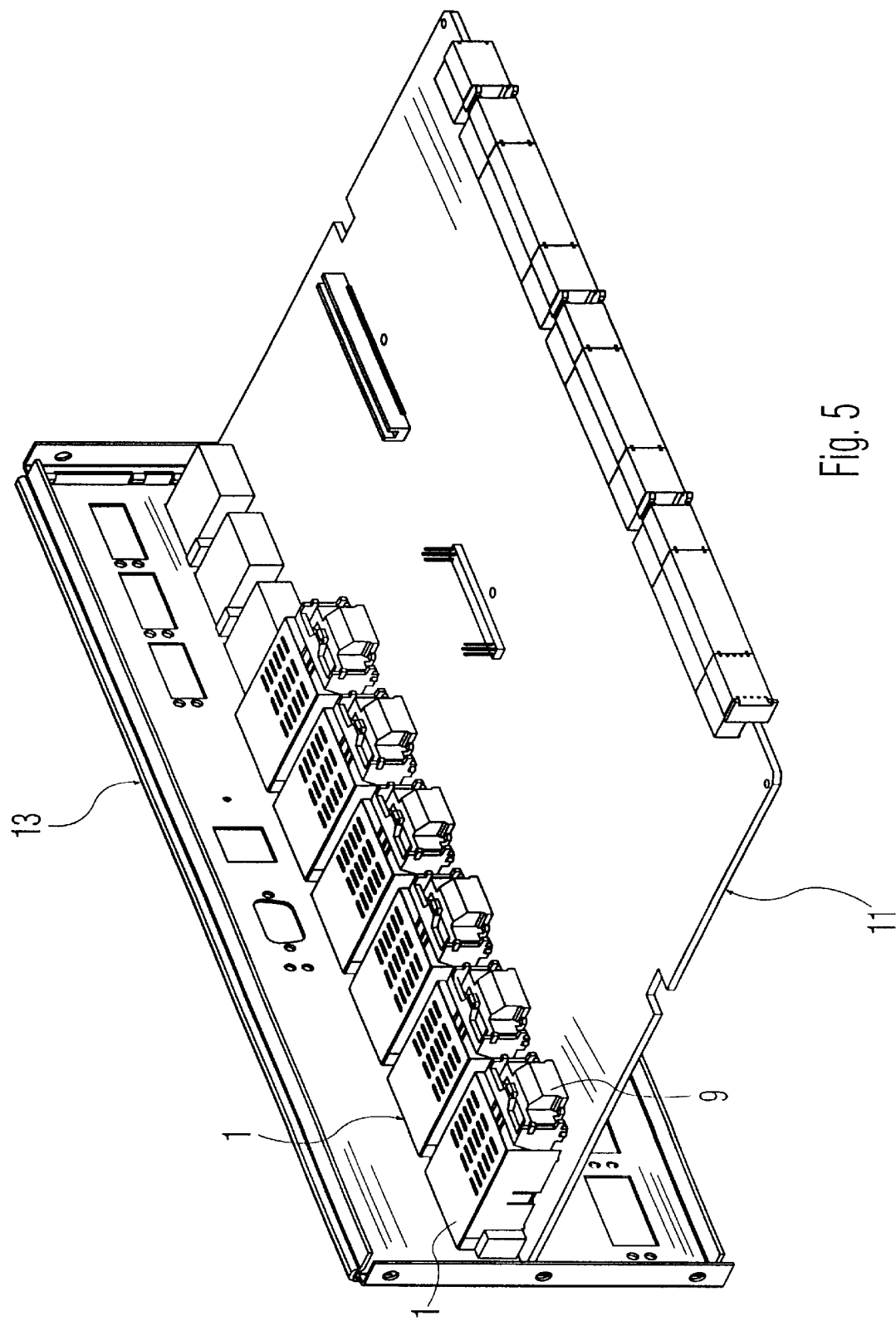
FIG. 5, is a perspective view of an assembled shield, carrier, circuit board and front panel.
Figures 6A, 6B, 6C:
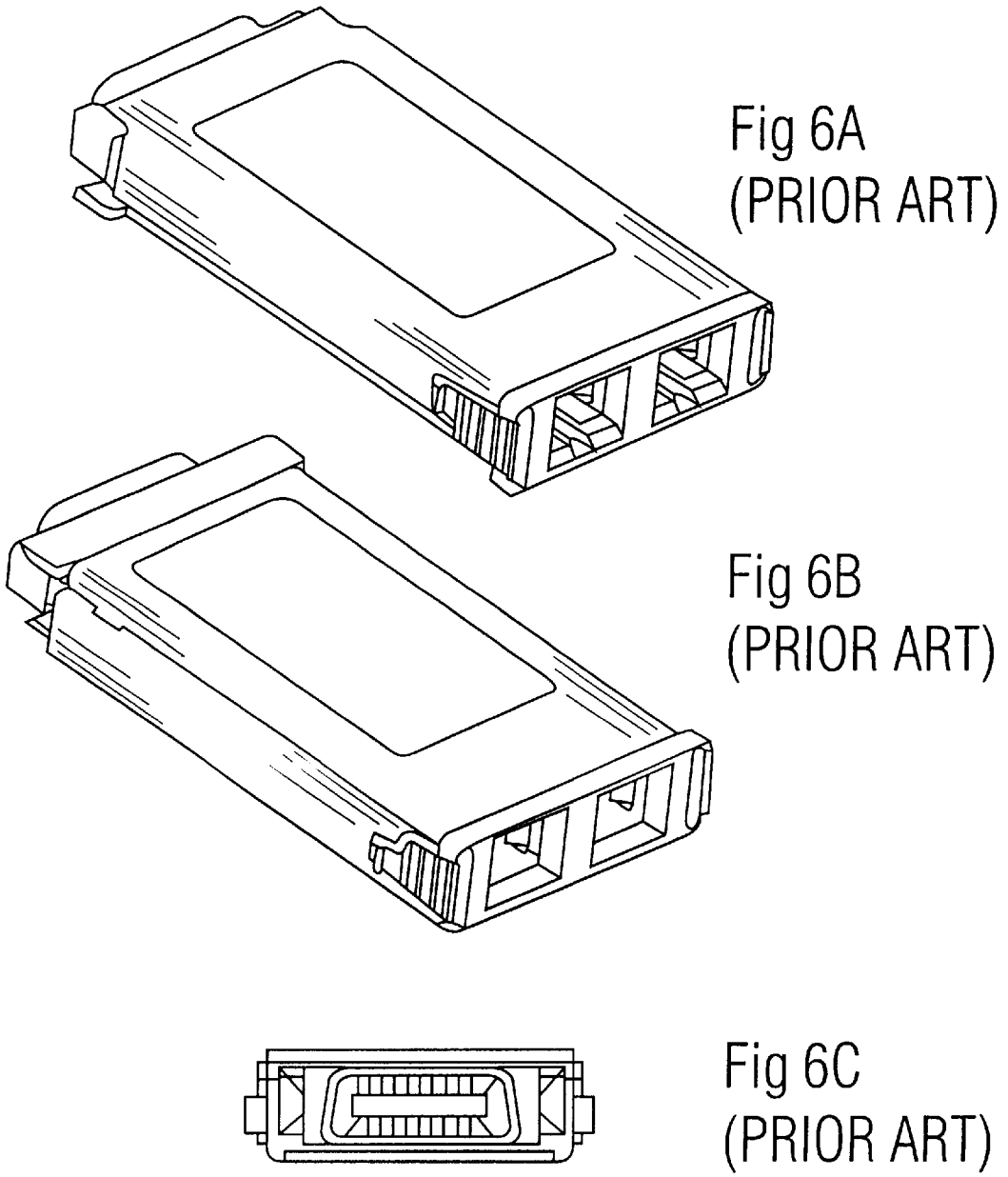
FIGS. 6a, 6b, and 6c are a top perspective, bottom perspective and rear view of a conventional transceiver.

The shield 1, and in particular the sides 3, have legs 33 which extend through holes 35 in the circuit board 11. These legs are electrically connected to the circuit board circuitry, preferably by means of soldering. The shield 1, and preferably the walls 3 have a locking connection means 37 which is formed by a tab 39 with an angled portion 41. The angled portion 41 fits into the groove 43 of the carrier 9 when the shield 1 is mounted on top of the carrier 9. The angled portion 41 locks the shield 1 on to the carrier 9 by a snap fit. The cover 5 defines cooling holes 45 to let heat escape from the transceiver when the shield is mounted on the carrier 9 as shown in FIG. 5.

The shield 1 has means, in the form of the material of the sheet metal, which blocks electromagnetic interference from both escaping from the transceiver located in the carrier means 9, and for preventing electromagnetic interference from other sources passing through the shield and into the transceiver. The electrical connection of the shield to the circuit board 11, the front panel 13, and the ground of the carrier 9 which is in turn connected to the ground of the transceiver and the ground of the cable, provides for a very effective blocking of electromagnetic interference. As can be seen from FIG. 5, the carriers 9 can be placed very close to each other in the final assembly when shields 1 are included with the carriers 9. The locking connection means 37 allows the shield 1 to be held to the carrier in a physical manner, which is particularly advantageous when making the electrical connection to the circuit board assembly 11. No further structure or tooling is needed to keep the shield 1 properly positioned with respect to the circuit board 11.

The features described in the specification, drawings, abstract and claims, can be used individually and in arbitrary combinations for practicing the present invention.

While specific embodiments of the invention have been shown and described in detail to illustrate the application of the principles of the invention, it will be understood that the invention may be embodied otherwise without departing from such principles.

What is claimed is:

1. An attachment for an electrical transceiver, the attachment comprising:

a wall and another wall electrically connectable to a circuit board arranged on one side of the transceiver, said wall and said another wall being positionable on opposite sides of the transceiver and blocking electromagnetic interference through said walls;

a cover electrically connected to said wall and said another wall, said cover being positionable adjacent another side of the transceiver opposite the circuit board, said cover blocking electromagnetic interference through said cover;

a panel portion electrically connected to said wall, said another wall, and said cover, said panel portion being electrically connectable to a panel arranged on still another side of the transceiver, said panel portion blocking electromagnetic interference though said panel portion;

carrier means positioned between the transceiver and the circuit board for attaching the transceiver to the circuit board said wall, said another wall, said cover and said panel portion forming a shield, said shield and said carrier means having carrier electrical connection means for electrically connecting said shield to said carrier means, said carrier means and said shield being connected together to form a housing for receiving the transceiver, said housing being connectable to the circuit board, the transceiver being insertable into, and removeable from, said housing while said housing is connected to the circuit board.

2. An attachment for an electrical transceiver in accordance with claim 1, wherein:

one of said wall and said another wall including board connection means for directly electrically connecting the board to said shield;

said panel portion including panel connection means for electrically connecting said panel portion to the panel.

3. An attachment for an electrical transceiver in accordance with claim 2, further comprising:

locking connection means arranged on said shield for locking said shield to said carrier means.

4. An attachment for an electrical transceiver in accordance with claim 3, wherein:

said locking connection means is arranged on said wail and includes a tab with an angled portion;

said carrier means includes a groove for receiving said angled portion.

5. An attachment for an electrical transceiver in accordance with claim 4, wherein:

another said locking connection means is arranged on said another wall and includes a tab with an angled portion;

said carrier means includes another groove for receiving said angled portion of said another locking connection means.

6. An attachment for an electrical transceiver in accordance with claim 2, wherein:

said carrier means includes a panel side defining an opening for receiving the transceiver, said panel side including a leaf spring electrically connected to a ground of said carrier means;

said carrier electrical connection means including a carrier surface of said panel portion in electrical contact with said leaf spring.

7. An attachment for an electrical transceiver in accordance with claim 6, wherein:

said carrier means has ground means for connecting a ground of said carrier means to a ground of the transceiver.

8. An attachment for an electrical transceiver in accordance with claim 7, wherein:

said ground means connects to a ground of a cable connected to the transceiver.

9. An attachment for an electrical transceiver in accordance with claim 6, wherein:

said panel connection means includes a leaf spring extending from a panel surface of said panel portion and in electrical contact with the panel, said panel surface being on a substantially opposite of side of said panel portion from said carrier surface.

10. An attachment for an electrical transceiver in accordance with claim 2, wherein:

said panel connection means includes a leaf spring electrically connected to said panel portion and in electrical contact with the panel.

11. An attachment for an electrical transceiver in accordance with claim 2, wherein:

said carrier means is a AMP Guide Assemble GBIC Carrier Module.

12. An attachment for an electrical transceiver in accordance with claim 2, wherein:

said carrier means includes a panel side defining an opening for receiving the transceiver though an opening in the panel, said panel side including a leaf spring electrically connected to a ground of said carrier means;

said carrier electrical connection means including a carrier surface of said panel portion in electrical contact with said leaf spring, said carrier means has ground means for connecting a ground of said carrier means to a ground of the transceiver and to a ground of a cable connected to the transceiver;

locking connection means are arranged on said shield and include a tab with an angled portion on each of said wall and said another wall, said carrier means includes a groove and another groove for receiving said angled portion of said wall and said another wall;

said panel connection means includes a leaf spring extending from a panel surface of said panel portion and in electrical contact with the panel, said panel surface being on a substantially opposite of side of said panel portion from said carrier surface;

said board connection means includes a leg extending through a hole in the circuit board;

said cover defines a plurality of cooling holes for cooling of the transceiver.

13. An attachment for an electrical transceiver, the attachment comprising:

a wall and another wall electrically connectable to a circuit board arranged on one side of the transceiver, said wall and said another wall being positionable on opposite sides of the transceiver and blocking electromagnetic interference through said walls;

a cover electrically connected to said wall and said another wall, said cover being positionable adjacent another side of the transceiver opposite the circuit board, said cover blocking electromagnetic interference through said cover;

a panel portion electrically connected to said wall, said another wall, and said cover, said panel portion being electrically connectable to a panel arranged on still another side of the transceiver, said panel portion blocking electromagnetic interference though said panel portion;

carrier means positioned between the transceiver and the circuit board for attaching the transceiver to the circuit board;

locking connection means arranged on said shield for locking said shield to said carrier means, said locking connection means is arranged on said wall and includes a tab with an angled portion;

said carrier means includes a groove for receiving said angled portion.

14. An attachment for an electrical transceiver in accordance with claim 13, wherein:

said wall, said another wall, said cover and said panel portion form a shield, said shield and said carrier means have carrier electrical connection means for electrically connecting said shield to said carrier means, one of said wall and said another wall includes board connection means for electrically connecting the board to said one wall and said another wall;

said panel portion includes panel connection means for electrically connecting said panel portion to the panel.

15. An attachment for an electrical transceiver, the attachment comprising:

a wall and another wall electrically connectable to a circuit board arranged on one side of the transceiver, said wall and said another wall being positionable on opposite sides of the transceiver and blocking electromagnetic interference through said walls;

a cover electrically connected to said wall and said another wall, said cover being positionable adjacent another side of the transceiver opposite the circuit board, said cover blocking electromagnetic interference through said cover;

a panel portion electrically connected to said wall, said another wall, and said cover, said panel portion being electrically connectable to a panel arranged on still another side of the transceiver, said panel portion blocking electromagnetic interference though said panel portion;

carrier means positioned between the transceiver and the circuit board for attaching the transceiver to the circuit board, said carrier means includes a panel side defining an opening for receiving the transceiver, said panel side including a leaf spring electrically connected to a ground of said carrier means;

said wall, said another wall, said cover and said panel portion forming a shield, said shield and said carrier means having carrier electrical connection means for electrically connecting said shield to said carrier means, said carrier electrical connection means including a carrier surface of said panel portion in electrical contact with said leaf spring;

one of said wall and said another wall includes board connection means for electrically connecting the board to said one wall and said another wall;

said panel portion including panel connection means for electrically connecting said panel portion to the panel.

* * * * *